United States Patent
Cantoli-Alves et al.

(10) Patent No.: US 10,673,997 B2
(45) Date of Patent: Jun. 2, 2020

(54) ACCESSORY FOR USE WITH A MOBILE ELECTRONIC DEVICE

(71) Applicant: POPSOCKETS LLC, Boulder, CO (US)

(72) Inventors: Vanessa C. Cantoli-Alves, Boulder, CO (US); Randy Yang Chiang, Boulder, CO (US); Altan Nahum, Boulder, CO (US)

(73) Assignee: POPSOCKETS LLC, Boulder, CO (US)

( * ) Notice: Subject to any disclaimer, the term of this patent is extended or adjusted under 35 U.S.C. 154(b) by 0 days.

(21) Appl. No.: 16/225,914

(22) Filed: Dec. 19, 2018

(65) Prior Publication Data

US 2019/0215388 A1    Jul. 11, 2019

Related U.S. Application Data

(60) Provisional application No. 62/737,444, filed on Sep. 27, 2018, provisional application No. 62/614,829, filed on Jan. 8, 2018.

(51) Int. Cl.
| | |
|---|---|
| *H04M 1/02* | (2006.01) |
| *A45C 11/00* | (2006.01) |
| *A45C 1/06* | (2006.01) |
| *A45C 11/18* | (2006.01) |
| *A45C 13/18* | (2006.01) |
| *H05K 5/02* | (2006.01) |

(52) U.S. Cl.
CPC .............. *H04M 1/026* (2013.01); *A45C 1/06* (2013.01); *A45C 11/00* (2013.01); *A45C 11/182* (2013.01); *A45C 13/185* (2013.01); *H05K 5/023* (2013.01); *H05K 5/0221* (2013.01); *A45C 2011/002* (2013.01)

(58) Field of Classification Search
CPC .......... H04M 1/026; A45C 1/06; A45C 11/00; A45C 11/182; A45C 13/185; A45C 2011/002; H05K 5/0221; H05K 5/023
See application file for complete search history.

(56) References Cited

U.S. PATENT DOCUMENTS

| | | | |
|---|---|---|---|
| D735,706 S | 8/2015 | Stevinson | |
| 9,787,348 B2* | 10/2017 | Srour | ................... H04B 1/3888 |
| 2010/0122439 A1 | 5/2010 | Britton et al. | |
| 2014/0066142 A1 | 3/2014 | Gipson | |
| 2014/0216976 A1 | 8/2014 | Conarro | |
| 2014/0357328 A1* | 12/2014 | Aharon | ................... H04M 1/04 |
| | | | 455/575.1 |
| 2015/0076020 A1* | 3/2015 | Smith | ..................... A45C 11/00 |
| | | | 206/320 |
| 2015/0382489 A1* | 12/2015 | Sorensen | ............. F16M 13/022 |
| | | | 248/558 |

(Continued)

OTHER PUBLICATIONS

International Application No. PCT/US2018/066137, International Search Report and Written Opinion, dated Mar. 25, 2019.

*Primary Examiner* — Wayne H Cai
(74) *Attorney, Agent, or Firm* — Irell & Manella LLP

(57) ABSTRACT

An accessory for a mobile electronic device includes a platform and a wallet. The platform is adapted to be attached to the mobile electronic device or a case for the mobile electronic device. The wallet is removably attached to the platform and configured to hold one or more objects associated with a user of the accessory.

18 Claims, 6 Drawing Sheets

(56) References Cited

U.S. PATENT DOCUMENTS

2016/0277056 A1   9/2016  Green
2018/0006676 A1   1/2018  Zavala
2019/0072998 A1*  3/2019  Hwang ................ G06F 1/1628

* cited by examiner

ACCESSORY FOR USE WITH A MOBILE ELECTRONIC DEVICE

CROSS-REFERENCE TO RELATED APPLICATION

Priority is claimed to U.S. Provisional Application 62/737,444, filed on Sep. 27, 2018, and U.S. Provisional Application 62/614,829, filed on Jan. 8, 2018, the entire contents of each of which are incorporated herein by reference.

FIELD OF THE DISCLOSURE

The present disclosure relates to accessories for mobile electronic devices, particularly an accessory that includes a wallet that is removably attachable to a mobile electronic device or a case for the mobile electronic device.

DETAILED DESCRIPTION OF THE DRAWINGS

The present disclosure relates to accessories for mobile electronic devices (e.g., smartphones, tablet computers, electronic readers, digital media players, cameras, and other mobile electronic devices). The accessories disclosed herein generally include a wallet that is removably attachable to a mobile electronic device or a case for the mobile electronic device. The wallet is configured to securely hold one or more objects (e.g., credit cards, identification cards, business cards, pictures, cash, keys, or the like) associated with (e.g., owned by) a user of the accessory (in many cases, the user will be using the mobile electronic device as well). Thus, when the wallet is attached to the mobile electronic device or the case therefor, the user can securely and easily store and carry such objects along with his/her mobile electronic device. At the same time, the wallet can be removed from the mobile electronic device (or the case) when desired (e.g., to reduce the profile of the mobile electronic device, in order to enable wireless charging).

Figure 1:
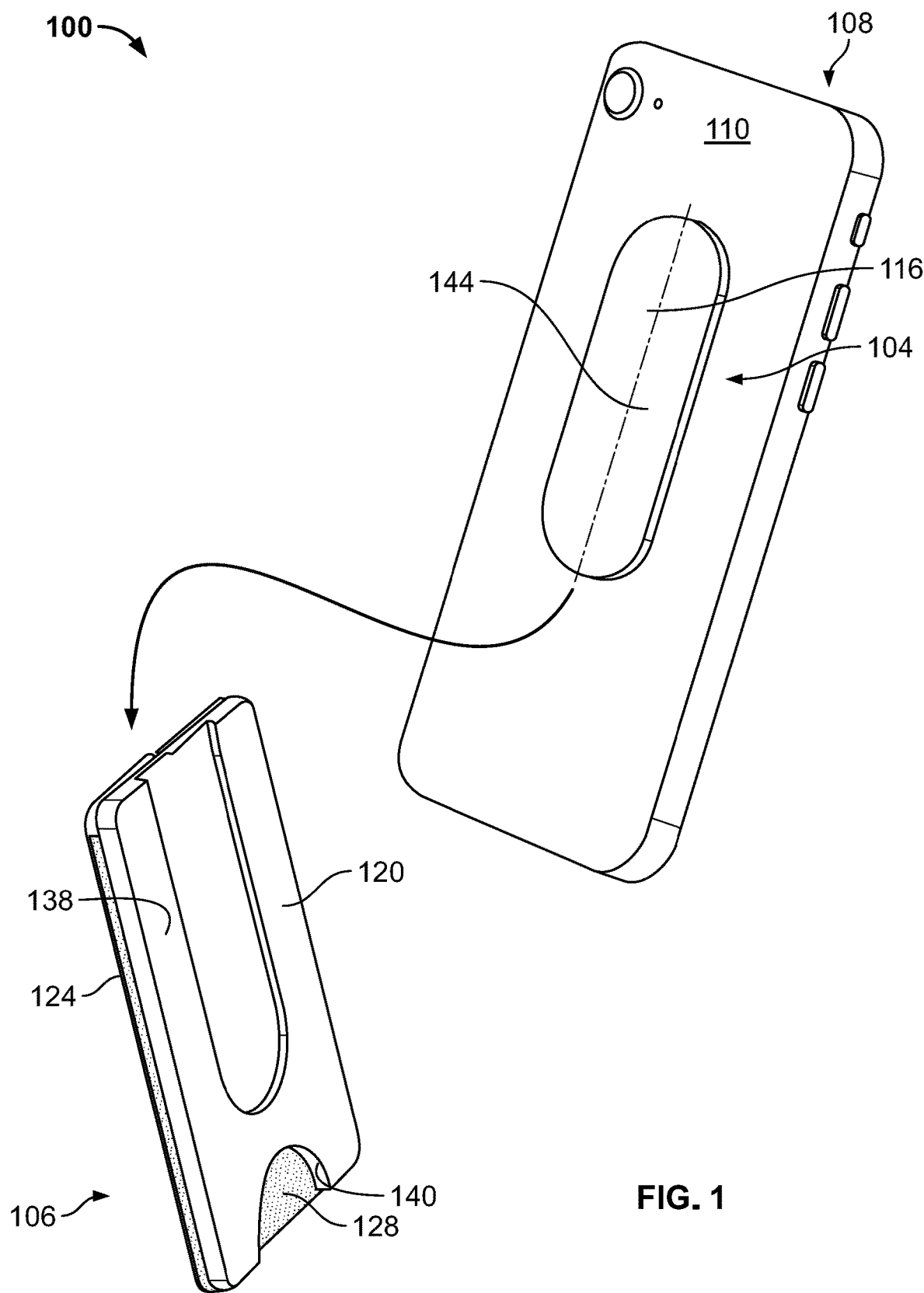
FIG. 1 is a perspective view of one example of an accessory for a mobile electronic device constructed in accordance with the teachings of the present disclosure, with a platform of the accessory attached to the mobile electronic device and a wallet of the accessory removed from the platform.
Figure 2:
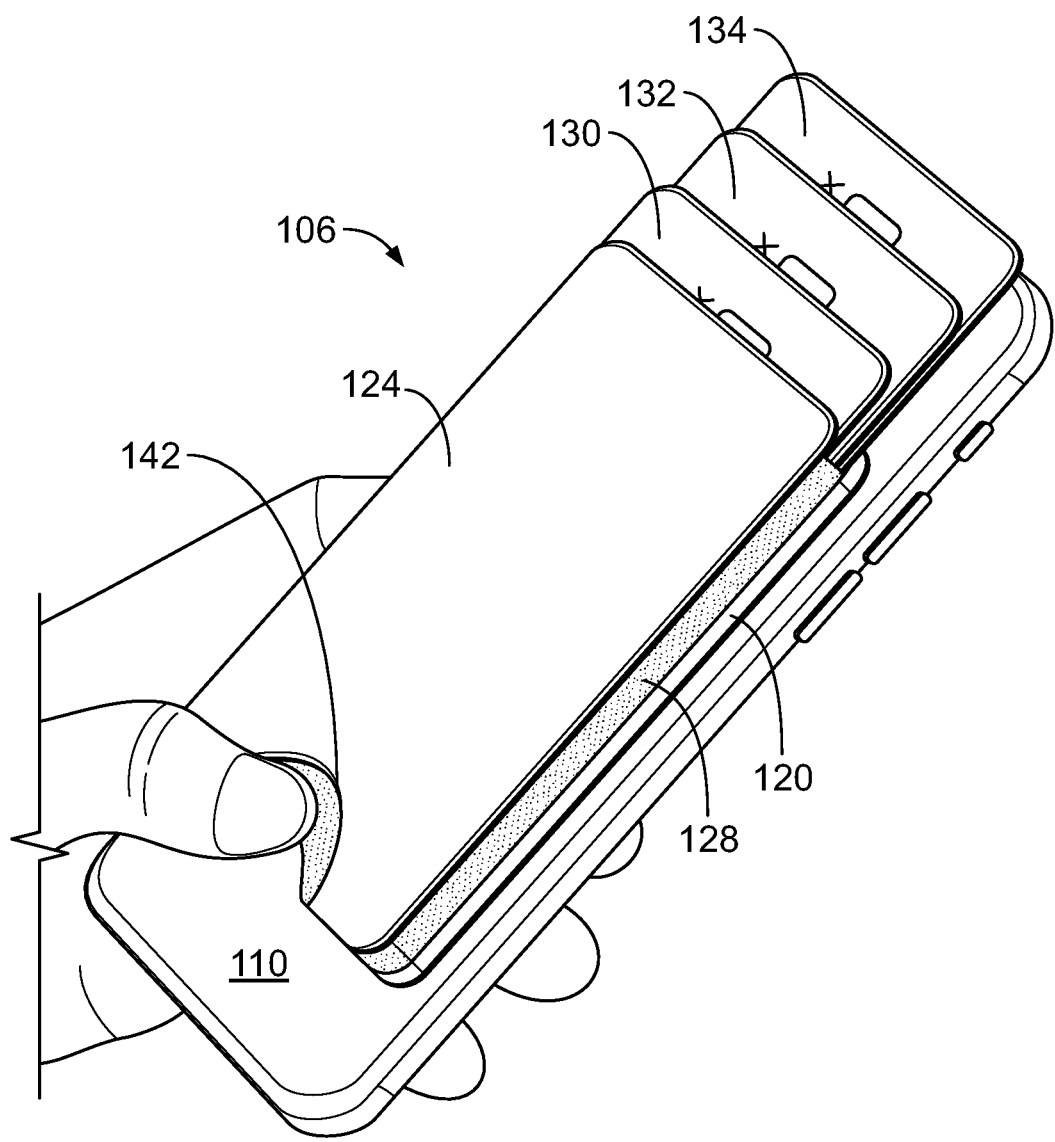
FIG. 2 is a perspective view of the accessory of FIG. 1, but with the wallet attached to the platform.
Figure 3:
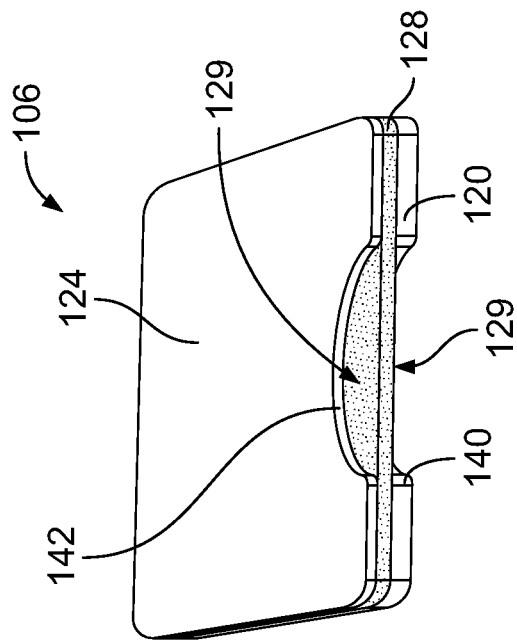
FIG. 3 is similar to FIG. 1, but shows the wallet removed from the platform for charging the mobile electronic device using a wireless charging device.
Figure 3:
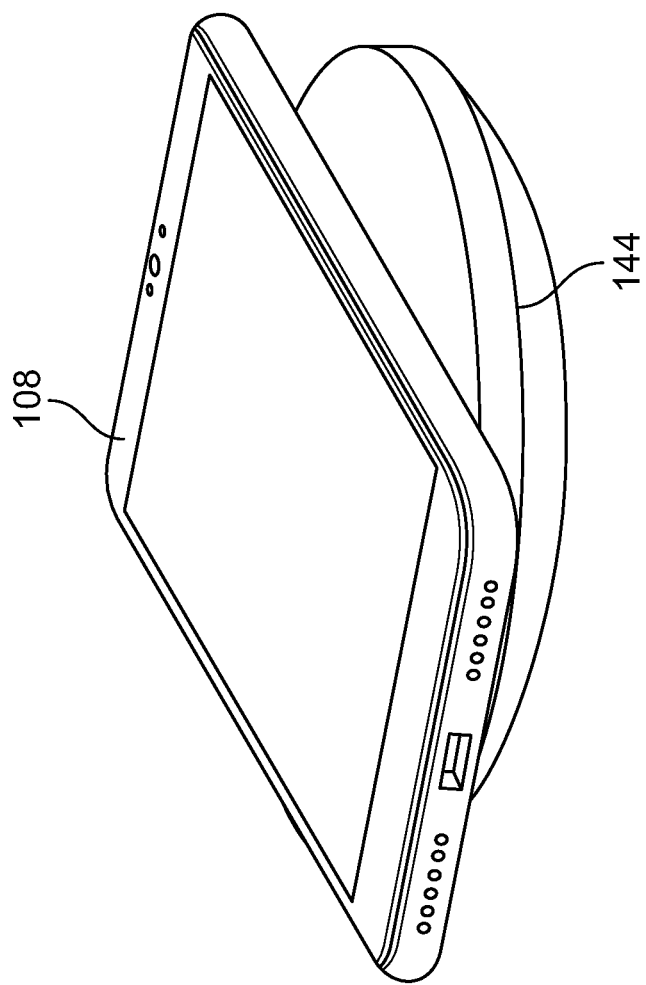

FIGS. 1-3 illustrate one example of an accessory 100 constructed in accordance with the present disclosure. The accessory 100 in this example includes a platform 104 and a wallet 106 that is removably attachable to the platform 104 and is generally configured to securely hold one or more objects for a user of the accessory 100. In other examples, the accessory 100 may include additional and/or different components.

In FIGS. 1-3, the platform 104 is shown as being removably attached to a mobile electronic device in the form of a smartphone 108. The platform 104 is removably attached to a rear surface 110 of the smartphone 108 via a securing element (not shown). The securing element preferably takes the form of a gel adhesive that is disposed on a portion or all of a first surface of the platform 104 (also not shown), such that the securing element securely attaches the platform 104 to the smartphone 108, but also allows the platform 104 to be removed and repositioned or replaced if necessary. The securing element may alternatively take the form of another type of adhesive (e.g., glue, tape) or mechanical locking means (e.g., threads, hook and loop fastening means, snap fit, a suction cup).

In other examples, however, the platform 104 may instead be removably attached to a case for the smartphone 108 or a different mobile electronic device. In yet other examples, the platform 104 may be permanently attached to or integrally formed with the smartphone 108 (or different mobile electronic device) or may be permanently attached to or integrally formed with a case for a mobile electronic device. When the platform 104 is permanently attached to or integrally formed with a case, the accessory 100 may be considered to include the case as well.

As best illustrated in FIGS. 1 and 3, the platform 104 in this example is an oval-shaped structure that has the first surface described above (but not shown) and a second surface 116 that is disposed opposite the first surface. It will be appreciated that the second surface 116 faces away from the smartphone 108 when the platform 104 is attached to the smartphone 108. In other examples, however, the platform 104 can have a different shape and/or size. For example, the platform 104 can have a rectangular, triangular, circular, hexagonal, octagonal, irregular, or other shape.

As illustrated, the wallet 106 in this example generally includes a first panel 120, a second panel 124 opposite the first panel 120, and an elastic element 128 that is coupled to the first and second panels 120, 124 so as to define one or more storage compartments for holding one or more objects (e.g., credit cards 130, 132, 134). In this example, the elastic element 128 is disposed between and fixedly attached to the first panel 120 and the second panel 124, thereby connecting the first and second panels 120, 124 but also defining two storage compartments 129 for holding one or more objects, as illustrated in FIG. 3. In other examples, the elastic element 128 may only be disposed between and fixedly attached to and disposed between edges of the first and second panels 120, 124, thereby connecting the first and second panels 120, 124, but only defining a single storage compartment.

The first panel 120 is preferably made of a rigid material (e.g., a hard plastic), though the first panel 120 can be made of a semi-rigid material or a flexible material. The first panel 120 includes a recess 138 that is formed only partially through the first panel, as is best illustrated in FIGS. 1 and 3. The recess 138 generally has a shape that conforms to the shape of the platform 104, such that the recess 138 is configured to removably receive and retain the platform 104. Thus, the recess 138 in this example has a U-shape that is sized to removably receive and retain the platform 104, which in this example is oval shaped. In other examples, e.g., when the platform 104 has a different size and/or shape, the recess 138 may have a different size and/or shape that conforms to this differently sized and/or shaped platform.

The first panel 120 also includes a cutout 140 that allows the user to guide objects into or out of one or both of the storage compartments 129. Like the first panel 120, the second panel 124 is preferably made of a rigid material (e.g., a hard plastic), though it too can be made of a semi-rigid material or a flexible material. The second panel 124 also includes a cutout 142 (which is identical to the cutout 140), but the second panel 124 is otherwise solid, i.e., it does not include a recess.

Meanwhile, the elastic element 128 in this example takes the form of an elastic sock that is made of a material that is flexible but is also rigid enough to retain its shape. In other words, the elastic element 128 is made of a material that permits user manipulation of the elastic element 128, e.g., when the user is inserting objects into or removing objects from the storage compartments 129, but biases the elastic element 128 back to its original position shown in FIGS. 1 and 3 when the elastic element 128 is released.

In other examples, the wallet 106 may include additional, fewer, and/or different components. As an example, the wallet 106 may employ a rigid element instead of the elastic element 128 to connect the first and second panels 120, 124. As another example, the wallet 106 may not include the cutout 140 and/or the cutout 142.

As discussed above, the wallet 106 is removably attachable to the platform 104. Thus, when desired (e.g., when the user wishes to carry the wallet 106 and any objects stored therein with the smartphone 108), the wallet 106 can be attached to the platform 104, as illustrated in FIG. 2. In this example, the wallet 106 can be attached to the platform 104 by manipulating the wallet 106 so that the recess 138 of the wallet 106 slidably receives the platform 104 along a longitudinal axis 144 of the platform 104. Conversely, when desired, the wallet 106 can be detached from the platform 104 in a similar but opposite manner, as illustrated in FIGS. 1 and 3. As an example, the user may wish to detach the wallet 106 in order to reduce the profile of the smartphone 108, to remove objects from the wallet 106, or to charge the smartphone 108 using the wireless charger device 144 shown in FIG. 3. In any case, in this example, the wallet 106 can be detached from the platform 104 by manipulating the wallet 106 so that the platform 104 slides out of the recess 138 along the longitudinal axis 144. In other examples, the wallet 106 can be attached to or detached from the platform 104 in a different manner. As an example, the wallet 106 can be removably attached to the platform 104 using an adhesive (e.g., gel adhesive, tape, glue), various mechanical means (e.g., hook and loop fastening means, threads, snap fit, a suction cup), or any other known means.

Figure 4:
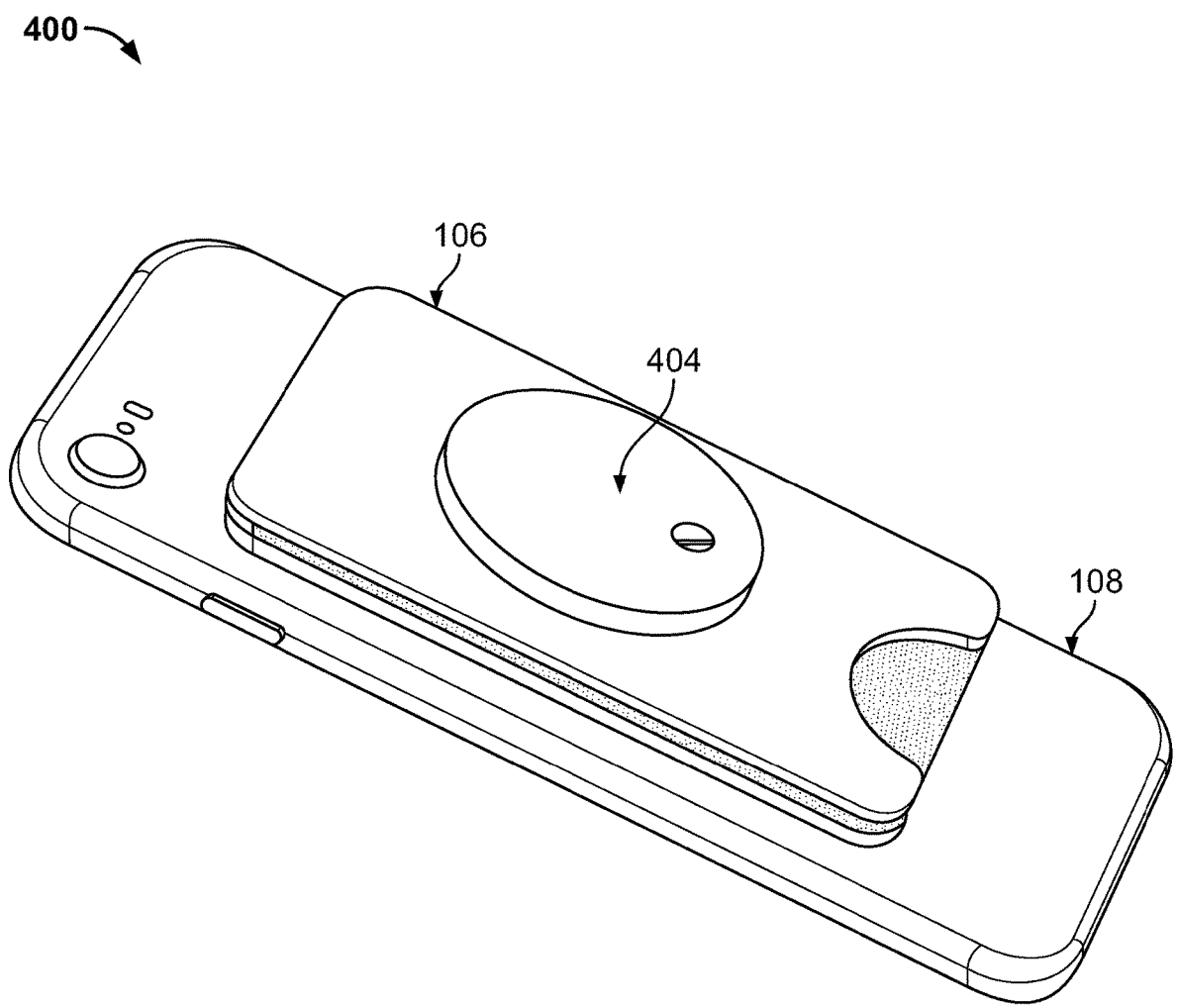
FIG. 4 is a perspective view of another example of an accessory for a mobile electronic device constructed in accordance with the teachings of the present disclosure.

FIG. 4 illustrates another example of an accessory 400 constructed in accordance with the present disclosure. The accessory 400 is similar to the accessory 100, with common components illustrated using common reference characters, but also includes a grip accessory 404 that may be removably attached to, permanently attached to, or integrally formed with the wallet 106. Further description of such grip accessories, which can be used, for example, as a docking accessory and for use as a grip and stand for a mobile electronic device, can be found in commonly owned U.S. Pat. No. 8,560,031, the entire disclosure of which is hereby incorporated by reference herein.

Figure 5:
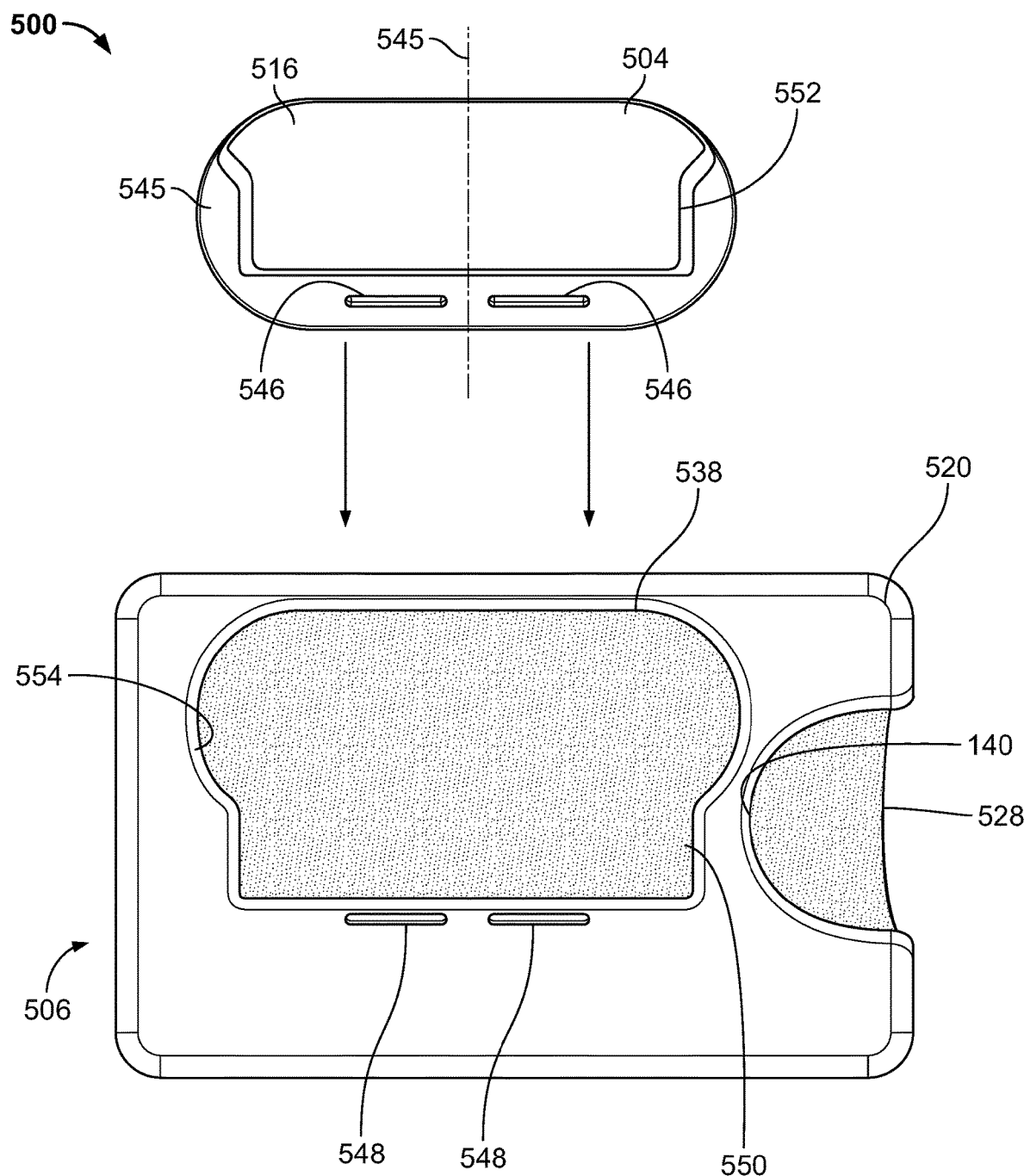
FIG. 5 is a top view of another example of an accessory for a mobile electronic device constructed in accordance with the teachings of the present disclosure, with a wallet of the accessory removed from a platform of the accessory.
Figure 6:
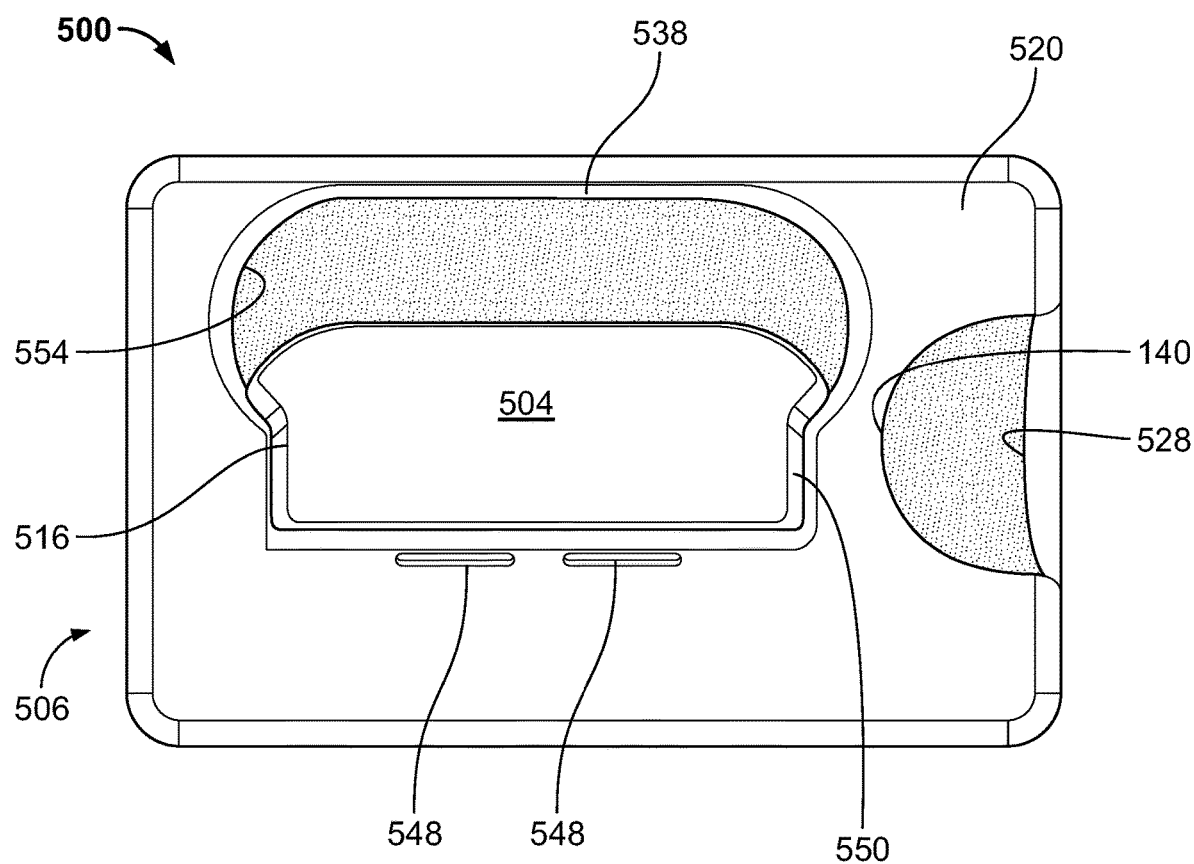
FIG. 6 is a top view of the accessory of FIG. 5, but with the wallet attached to the platform.

FIGS. 5 and 6 illustrate another example of an accessory 500 constructed in accordance with the present disclosure. The accessory 500 is similar to the accessory 100, with common components illustrated using common reference characters, but differs in the manner described below.

First, the platform 504, while otherwise similar, has a structure that is different from the platform 104. Like the platform 104, the platform 504 has an oval-shape. However, unlike the platform 104, the platform 504 includes a recessed portion 545 (recessed relative to the second surface 516, which, like the second surface 116, faces outward, away from the smartphone 108 when the platform 504 is attached to the smartphone 108) and plurality of teeth 546 that extend outward from the recessed portion 545 at or proximate to a perimeter edge of the platform 504. In this example, the plurality of teeth 546 extend outward, away from the smartphone 108 when the platform 504 is attached to the smartphone 108.

Second, the wallet 506 has a structure that is different from the wallet 106. In particular, the wallet 506 includes a recess 538 that is different than the recess 138. The recess 538, like the recess 138, generally has a shape that conforms to the shape of the platform 504, such that the recess 538 is configured to removably receive and retain the platform 504. However, the recess 538, unlike the recess 138, includes a channel 550 that opens into an oval-shaped portion 554. The channel 550 is generally configured to slidably receive the first surface 516 of the platform 504, which has a substantially rectangular profile. In this example, the channel 550 is a rectangular channel that receives the first surface 516. However, it should be noted that the channel 550 and the first surface 516 may instead take a different shape (e.g., a circular shape). Moreover, the wallet 506 also includes a plurality of slots 548 formed adjacent the channel 550 of the wallet 506 to receive the plurality of teeth 546 of the platform 504.

Further, the wallet 506 is coupled to the platform 504 in a different manner than the wallet 106 is coupled to the platform 104. Like the wallet 106, the wallet 506 can be releasably attached to the platform 504 by manipulating the wallet 506 so that the recess 538 of the wallet 506 slidably receives the platform 504. However, unlike the wallet 106, the wallet 506 is manipulated so that the recess 538 slidably receives the platform 504 along a transverse axis 545 of the platform 504, as illustrated in FIG. 5. In other words, the wallet 506 is slidable in a horizontal direction to dispose the platform 504 in the recess 538, rather than in a vertical direction (as is the case to dispose the platform 104 in the recess 138). The plurality of teeth 546 are then moved into engagement with the plurality of slots 548 in the wallet 506 (e.g., by snapping the teeth 546 in the slots 548), as illustrated in FIG. 6, thereby securely attaching the platform 504 to the wallet 506 (and vice-versa). In other examples, however, the platform 504 may be securely attached to the wallet 506 by other mechanical locking means (e.g., threads, hook and loop fastening means). Conversely, when desired, the wallet 506 can be detached from the platform 504 in a similar but opposite manner.

Finally, while not illustrated herein, it will be appreciated that a grip accessory such as the grip accessory 404 may be removably attached to, permanently attached to, or integrally formed with the wallet 506.

The invention claimed is:

1. An accessory for a mobile electronic device, the accessory comprising:
a platform adapted to be attached to the mobile electronic device or a case for the mobile electronic device;
a wallet removably attached to the platform, the wallet configured to hold one or more objects associated with a user of the accessory, wherein the wallet is slidably attachable to the platform along a transverse axis of the platform; and a grip accessory coupled to the wallet, the grip accessory comprising:
- a base;
- a button spaced relative to the base, wherein the button is movable relative to the base; and
- a skin coupled to the base, wherein the button is coupled to the skin opposite the base, and wherein the skin is deformable between a collapsed configuration and an expanded configuration.

2. The accessory of claim 1, wherein the platform comprises a securing element for attaching the platform to the mobile electronic device or the case for the mobile electronic device.

3. The accessory of claim 2, wherein the securing element comprises a gel adhesive.

4. The accessory of claim 1, wherein the wallet comprises a recessed opening sized to removably receive the platform to removably attach the wallet to the platform.

5. The accessory of claim 1, wherein the wallet is slidably attachable to the platform along a longitudinal axis of the platform.

6. The accessory of claim 1, wherein the wallet comprises first and second panels and an elastic element arranged between the first and second panels, wherein the first and second panels and the elastic element define one or more storage compartments sized to hold the one or more objects.

7. The accessory of claim 6, wherein the elastic element connects the first and second panels.

8. The accessory of claim 6, wherein the elastic element defines a plurality of storage compartments sized to hold the one or more objects.

9. The accessory of claim 1, wherein the grip accessory is integrally formed with the wallet.

10. An accessory for a mobile electronic device, the accessory comprising:
- a platform adapted to be attached to the mobile electronic device or a case for the mobile electronic device;
- a wallet removably attached to the platform, the wallet configured to hold one or more objects associated with a user of the accessory; and
- a grip accessory coupled to the wallet, the grip accessory comprising:
  - a base;
  - a button spaced relative to the base, wherein the button is movable relative to the base; and
  - a skin coupled to the base, wherein the button is coupled to the skin opposite the base, and wherein the skin is deformable between a collapsed configuration and an expanded configuration.

11. The accessory of claim 10, wherein the platform comprises a securing element for attaching the platform to the mobile electronic device or the case for the mobile electronic device.

12. The accessory of claim 11, wherein the securing element comprises a gel adhesive.

13. The accessory of claim 10, wherein the wallet comprises a recessed opening sized to removably receive the platform to removably attach the wallet to the platform.

14. The accessory of claim 10, wherein the wallet is slidably attachable to the platform along a longitudinal axis of the platform.

15. The accessory of claim 10, wherein the wallet comprises first and second panels and an elastic element arranged between the first and second panels, wherein the first and second panels and the elastic element define one or more storage compartments sized to hold the one or more objects.

16. The accessory of claim 15, wherein the elastic element connects the first and second panels.

17. The accessory of claim 15, wherein the elastic element defines a plurality of storage compartments sized to hold the one or more objects.

18. The accessory of claim 10, wherein the grip accessory is integrally formed with the wallet.

* * * * *